United States Patent [19]

Nishizawa

[11] 4,404,575
[45] Sep. 13, 1983

[54] SEMICONDUCTOR DEVICE

[75] Inventor: Jun-ichi Nishizawa, Sendai, Japan

[73] Assignee: Zaidan Hojin Handotai Kenkyu Shinkokai, Sendai, Japan

[21] Appl. No.: 374,301

[22] Filed: May 3, 1982

Related U.S. Application Data

[63] Continuation of Ser. No. 96,649, Nov. 23, 1979.

[30] Foreign Application Priority Data

Jan. 22, 1979 [JP] Japan .................................. 54-6356

[51] Int. Cl.³ ...................... H01L 29/72; H01L 29/80
[52] U.S. Cl. ........................................ 357/22; 357/13; 357/20; 357/55; 357/57
[58] Field of Search .................... 357/22 E, 22, 22 V, 357/23, 41, 20

[56] References Cited

U.S. PATENT DOCUMENTS

| | | | |
|---|---|---|---|
| 4,198,648 | 4/1980 | Nishizawa | 357/22 X |
| 4,284,997 | 6/1978 | Nishizawa | 357/22 |
| 4,338,618 | 7/1982 | Nishizawa | 357/22 X |

Primary Examiner—William L. Sikes
Attorney, Agent, or Firm—Cushman, Darby & Cushman

[57] ABSTRACT

A semiconductor device which, due to a feedback current flowing through a resistance present between the gate region and a primary current path channel region, exhibits a very steeply rising drain current versus voltage characteristic and has a very small resistance during conduction.

10 Claims, 34 Drawing Figures

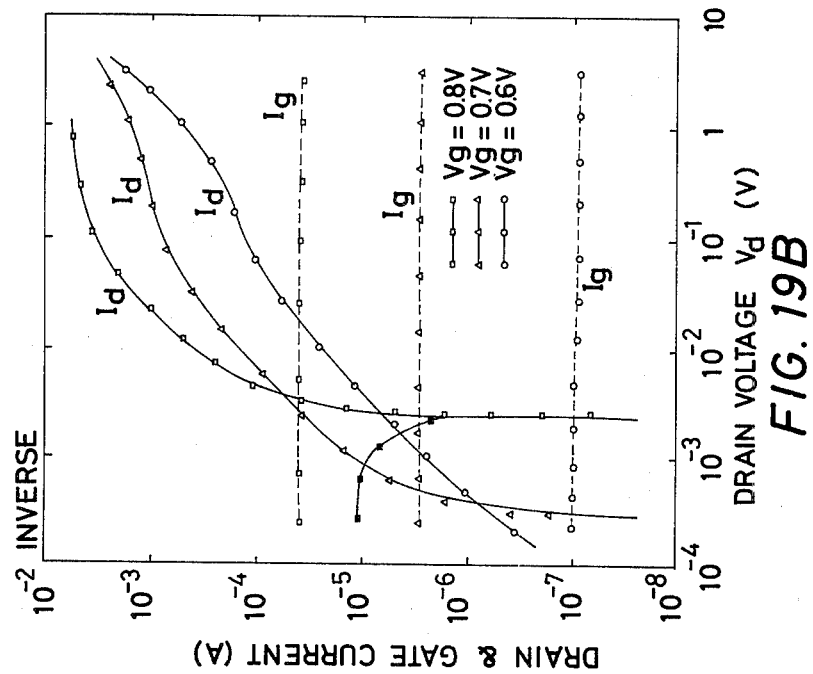
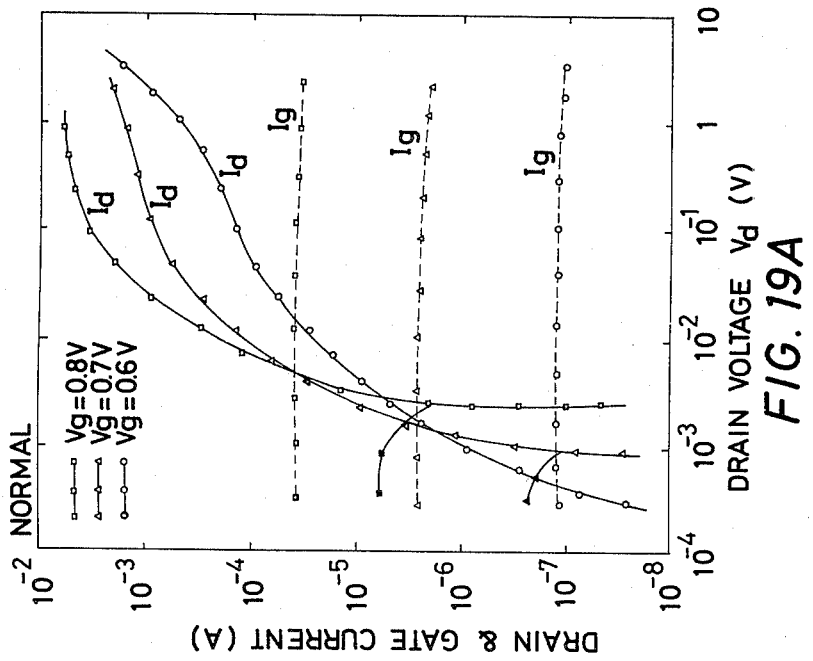
FIG. 19A
FIG. 19B

SEMICONDUCTOR DEVICE

This is a continuation, of application Ser. No. 096,649 filed Nov. 23, 1979.

BACKGROUND OF THE INVENTION (a) Field of the Invention

The present invention concerns a semiconductor device which exhibits a very steeply rising current versus voltage characteristics and which has a very small output resistance. These characteristics are provided by the feedback action of the gate current flowing through a resistance distributed between the gate region and a primary current channel region.

(b) Description of the prior art

In a field effect transistor (hereinafter to be referred to as FET), when the drain voltage is small as compared with the saturating drain voltage, the drain current increases linearly with the drain voltage. That is, the drain current vs. drain voltage ($V_d/I_d$) relationship is similar to a resistance. This relationship between the current and the voltage is not dependent upon the particular structure or type of the FET, and is manifested in both junction FET's (hereinaffter referred to as JFET) and insulated-gate type FET's (hereinafter to be referred to as MOS-FET).

A static induction transistor (hereinafter to be referred to as SIT) exhibits a non-saturating current versus voltage characteristic. Under gate bias conditions that provide carriers within the channel region, the SIT also exhibits a substantially linear current versus voltage characteristics. Needless to say, there the current tends to saturate at high levels of drain voltage.

Under bias conditions whereby the channel region of an SIT is completely pinched off, a potential barrier is produced in the foreground of the source region. This potential barrier decreases in response to an increase in the drain voltage. Thus the number of carriers flowing from the source toward the drain will increase in substantially exponential relation to the drain voltage. Thus, for small drain currents, the drain current $I_d$ increases exponentially relative to the drain voltage $V_d$. Expressed mathematically, (particularly for reverse gate bias operation):

$$I_d \propto e^{\eta \cdot \frac{qV_d}{\mu kT}}$$

wherein:

$\eta$ represents structural parameter (numerical)
$\upsilon$ represents voltage amplification factor;
q represents unit electric charge;
k represents Boltzmann constant; and
T represents absolute temperature.

In other words, the increase in drain current can be expressed basically in terms of Maxwell-Boltzmann statistics.

SUMMARY OF THE INVENTION

It is the object of the present invention to provide a semiconductor device having a very low output impedance to provide a drain current which increases more steeply with respect to a range of drain voltages than the aforesaid linear increase and exponential increase.

BRIEF DESCRIPTION OF THE DRAWINGS

FIG. 19 indicates the drain current-drain voltage characteristic of the example in FIG. 16 having the gate mask spacing of 6 $\mu$m, wherein the normal operation is shown in FIG. 19A, and the inverse operation is shown in FIG. 19B.

DETAILED DESCRIPTION OF THE PREFERRED EMBODIMENTS

Figure 1:
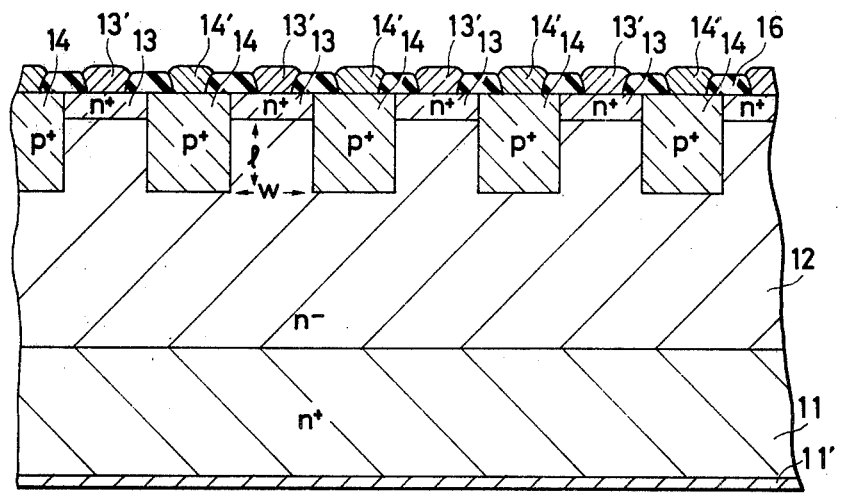
FIG. 1 is a diagrammatic sectional view of an embodiment of the semiconductor device of the present invention.

FIG. 1 is a diagrammatic sectional view of an embodiment of the semiconductor device of the present invention.

An n+ type region 11 provides a substrate and constitutes a drain region. An n− epitaxial layer 12 is formed on region 11, to provide a channel region. An n+ source region 13 is formed in epitaxial layer 12. A p+ gate region 14, is also formed in epitaxial layer 12. Reference numerals 11', 13' and 14' designate a drain electrode, a source electrode and a gate electrode, respectively. Electrode 11', 13', and 14' are suitably each made of a metal such as Al, Mo, W, Au and like metals, a low resistivity polysilicon, or a combination of the foregoing. Numeral 16 designates an insulating layer made of such substance as $SiO_2$, $Si_3N_4$, $Al_2O_3$, AlN or their mixture. Symbol W designates the "channel width," that is the distance between the respective gate regions 14. Symbol l designates the channel length. In a normally-off type device a high potential barrier is produced in the channel region by the built-in potential between the gate region and the channel region. Accordingly, the injection of carriers from the source region is cut off in the absence of a gate bias voltage. In such a device, it is required that the value of the ratio l/w be about 0.7 or more. It is preferable that l/w ratio be 1 or more. However, the ratio required in a given device depends on the impurity concentration $N_D$ of the n− region 12. The required value of l/w will increase with an increase in the impurity concentration $N_D$ of the channel region, and with an increase in the drain voltage. In FIG. 1, the source region and the gate regions are constructed usually in an inter-digital form. Alternatively, the construction could be that the source region is perfectly or almost completely surrounded by the gate region.

Figure 2A:
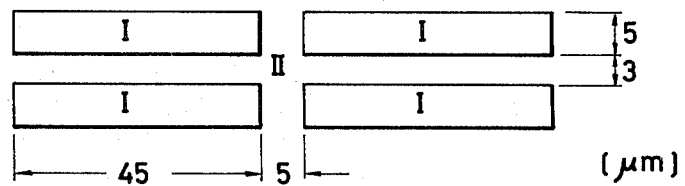
FIG. 2A is a diagrammatic top plan view of an example of the mask employed in the manufacture of the semiconductor device shown in FIG. 1.
Figure 2B:
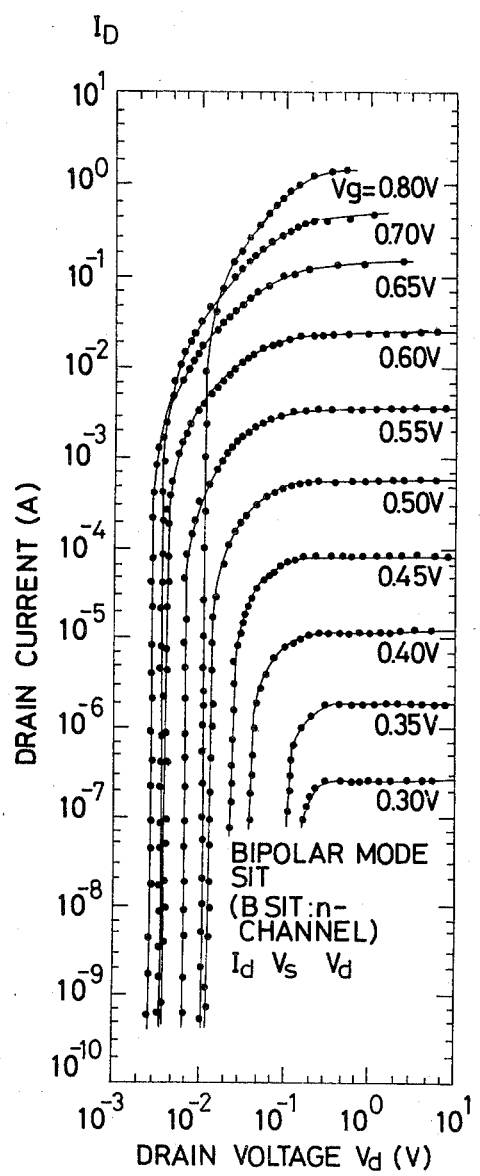
FIGS. 2B and 2C are typical characteristic charts of the semiconductor device shown in FIG. 1.

The n+ source region and p+ type gate regions 14 may be constructed by the use of a mask as shown in FIG. 2A. In FIG. 2A, the region I corresponds to the n+ source region 13 (and underlying channel region), and the regions 14 II corresponds to the p+ type gate region at mask level, respectively. Exemplary numerical values for the mask dimensions of these regions are provided in FIG. 2a. By utilizing a conventional self-alignment technique using $SiO_2$ film and $Si_3N_4$ film, a test device having a diffusion depth of 2.2 μm of the p+ type gate regions has been fabricated. The test device including 9,900 regions I, i.e. channels. The thickness of the epitaxial layer 12 was 12 μm, and had an impurity concentration of $5 \times 10^{13}$ cm$^{-3}$. The test device manifested almost perfect normally-off operation. That is, when the applied gate voltage is zero (meaning that the gate region and the source region are at the same potential), there is substantially no flow of drain current. Drain current begins to flow only in response to an application of a positive gate bias voltage. The relationship between the drain current $I_d$ and the drain voltage $V_d$ of this device is shown in FIG. 2B, with the gate voltage serving as the running parameter. Both abcissa and ordinate in FIG. 2b are plotted in logarithmic scale. In the drain voltage region above about 50 mV the drain current increases with increases in the positive gate voltage. On the other hand, in the region of smaller drain voltages, the value of the drain voltage at which a drain current begins to flow, i.e. the threshold voltage, becomes gradually lower with increases in the gate voltage over the range of gate voltage from 0.3 V up to 0.65 V. The current therefore flows more readily. However, when the gate voltage rises to 0.7 V or to 0.8 V, the value of the drain voltage at which the drain current begins to flow, i.e. the threshold voltage, increases gradually. Furthermore, especially when the gate voltge is greater than 0.5 V, the drain current rises very sharply once it has begun to flow. For example, when the gate voltage $V_g$ is 0.8 V, the drain current will increase by 8 orders of magnitude with an increase in the drain voltage of only about 2 mV. As shown in the characteristic of FIG. 2B, the saturating drain voltage of the device (i.e. the drain voltage at which saturation of the drain current occurs) saturation of the drain is very small, (approximately 0.1 V), despite the fact that a distance between the source region and the drain region is as great as 12 μm.

In other words, the present device exhibits a very low output impedance. Since both are output impedance and the saturating drain voltage are small, a device according to the present invention can operate at a low voltage, yet exhibits a great driving capability for a subsequent stage. Thus, such a device is suitable for use in integrated circuitry. In addition, a device in accordance with the present invention has a very small voltage drop. Accordingly, the device can also provide very efficient operation in a high power device.

As will be clear from the characteristic shown in FIG. 2B, the relation between the saturated drain current $I_d$ and the forward gate voltage $V_g$ is almost perfectly exponential in the small drain current region (i.e., gate voltages below 0.65 V). This relationship may be expressed as:

$$I_d \propto e^{\frac{qV_g}{nKT}}.$$

In the characteristic shown in FIG. 2B, the numerical factor "n" in the aforementioned formula is almost equal to 1 (unity). When $V_g$ becomes 0.7 V or higher the increase in the drain current in response to changes in $V_g$, $I_d$ become less than that expected from an exponential relationship.

Figure 2C:
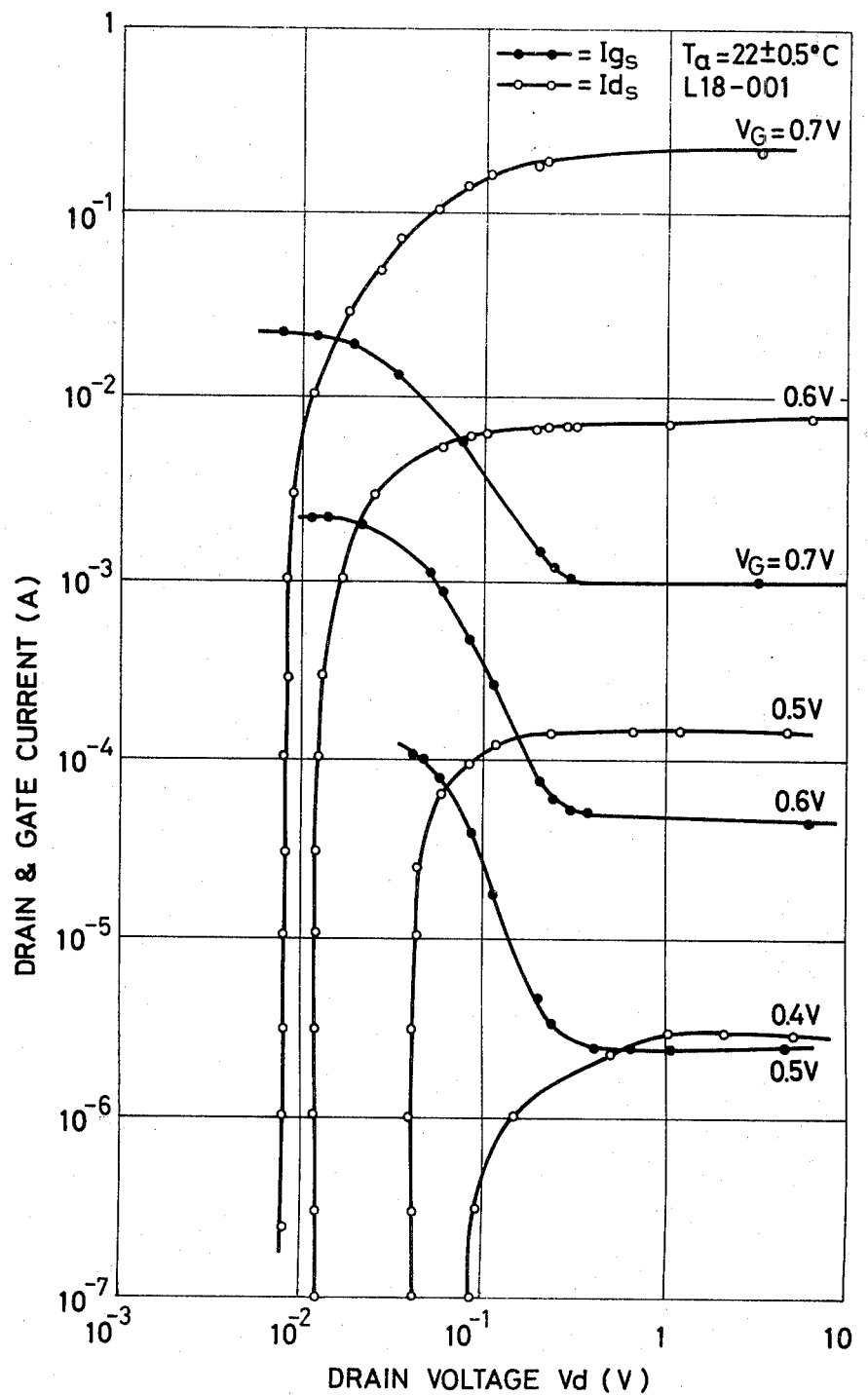

In FIG. 2C, the drain current $I_d$ and the gate current $I_g$ are shown as the functions of the drain voltage $V_d$. Small open circles represent $I_d$ and solid black dots represent $I_g$. FIG. 2c illustrates typical $I_d - V_d$ characteristics for $V_g$ is 0.4 V, 0.5 V, 0.6 V and 0.7 V. It should be noted that $I_g$ decreases with an increase in $V_d$. For $V_d$ above the several mV, $I_g$ becomes almost constant. The reason that the characteristics of FIG. 2c are exhibited are as follows.

In the small drain voltage region, the gate to drain junction is forwardly biased. Accordingly a current flows from the gate region toward the drain region. With increased drain voltage, the gate to drain current flow decreases, and ultimately ceases. At this point the gate current consists of only a forward current between the gate and the source regions.

A semiconductor device in accordance with the present invention provides a drain current $I_d$ which may increase by 7 or 8 orders of magnitude, in response to an increase in the drain voltage of only about 2 or 3 mV. Such a low output impedance has never been noted in conventional devices.

The principles of operation of a device in accordance with the present invention will hereinafter be explained in conjunction with FIGS. 3 through 5.

Figure 3:
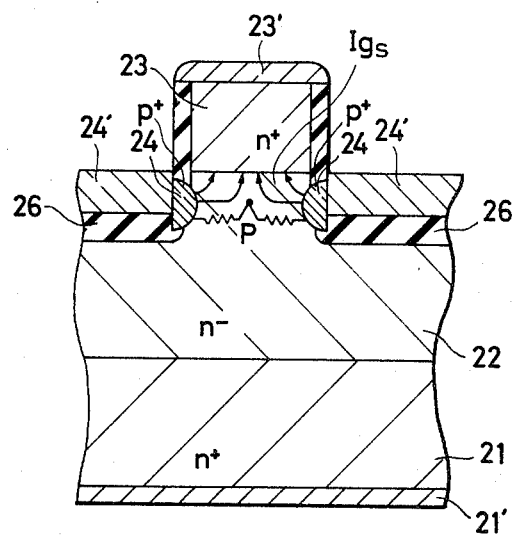
FIG. 3 is a diagrammatic sectional view of a semiconductor device for explaining the principles of the present invention.

FIG. 3 shows a device in accordance with the present invention having a step-cut structure P+ gate regions 24 are provided locally in the side walls of a recessed portion. In the device of FIG. 3, the channel is formed in an N− region 22. Region 22 is formed on an n+ drain region 21. Numerals 21', 23' and 24' designate a drain electrode, a source electrode and a gate electrode. Numeral 26 designates an insulating layer.

An intrinsic gate, P, is indicated by a black dot. The potential of the barrier across the channel region in a transverse direction is the lowest at the intrinsic gate. Conversely, the potential of the barrier is highest in the longitudinal source-to-drain direction at the intrinsic gate. Thus, the potential barrier is saddle-shaped with the saddle apex disposed at the intrinsic gate. The region between the gate regions 24 and the intrinsic gate P a portion of (the channel region) is formed of a high resistivity material, a high resistance $r_{vb}$ is present between the gate region 24 and virtual gate point P.

Figure 4:
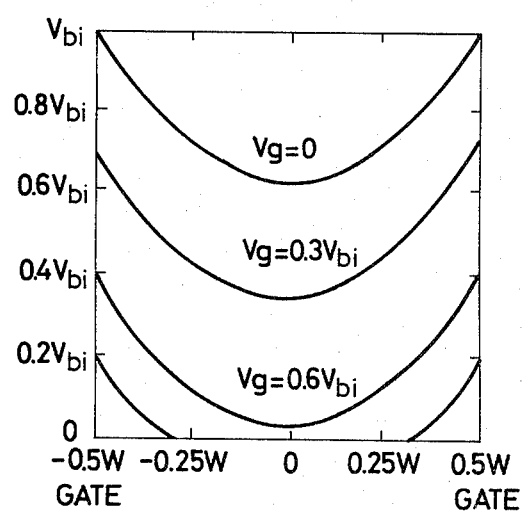
FIGS. 4 and 5 are potential distribution charts across the channel region in the instance wherein the gate current is disregarded and in the instance the gate current is taken into consideration.
Figure 5:
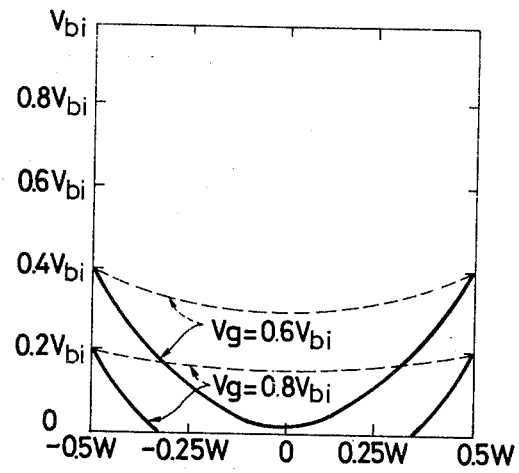

FIG. 4 illustrates an example of the potential distribution in the channel region between the gate regions. The higher this potential is, the more difficult it is for electrons to traverse the channel. The potential distribution shown in FIG. 4 will vary depending on the impurity concentration $N_D$ of the channel region, the channel width W (i.e., distance between the gate regions), the length l of the channel region, and the drain voltage $V_d$. In one case illustrated in FIG. 4 a very high barrier exists at $V_g=0$. FIG. 4 shows the variation of the potential distribution due to the application of a forward gate voltage. The injection of holes from the gate regions and electrons from source-to-gate regions, i.e. the gate current, are not taken into consideration. The potential distribution for $V_g=0$, $0.3 V_{bi}$, $0.6 V_{bi}$ and $0.8 V_{bi}$ are shown. $V_{bi}$ represents a built-in potential between the gate region and the channel region. For a p+n−junction of silicon, $V_{bi}$ will assume a value of about 0.6 V ~0.8 V. In the case of GaAs, $V_{bi}$ exhibits a value a little greater than these. When $V_g=0.6 V_{bi}$, the height of the potential barrier becomes sufficiently low. At $V_g=0.8 V_{bi}$, the potential barrier disappears.

In FIG. 4, the gate current $I_g$ is disregarded. Since the gate region is forward biased, there is, in fact, a flow of gate current. Holes tend to reach a site having a higher potential shown in FIG. 4 with little difficulty as gate region 24 is forward biased with respect to the source region 23, a number of holes are injected from the gate region toward intrinsic gate P (and thus toward source 23). Therefore, a gate current as shown by arrows in FIG. 3 flows. When the drain voltage is low (near 0), the gate drain junction is also forward biased. Thus, not only does current $I_{gs}$ flow between the gate region 24 and the source region 23, but a current $I_{gd}$ (not shown) also flows between the gate region 24 and the drain region 21.

In order to provide a normally-off operation, the gate-to-gate distance W and the impurity concentration $N_D$ are selected to satisfy at least the relationship: $N_D W^2 < 2.0 \times 10^7$ cm$^{-3}$. The channel region is formed in a high resistivity epitaxial layer. Accordingly, a high resistance $r_{vb}$ is present between the gate region and the intrinsic gate (in the main current path). A gate current must flow through this resistance. Therefore, the actual potential distribution across the channel region is not as shown in FIG. 4, but rather will be as shown by dotted line in FIG. 5. That is, even when a forward gate bias is applied, the potential in the vicinity of the intrinsic gate will not decrease as shown in FIG. 4, but rather will exhibit a distribution as shown by dotted line in FIG. 5. In other words, the height of the potential barrier as viewed from the source side remains substantially high.

When a drain voltage is applied, to lower the potential of the drain, gate current decreases. Electrons, which until that point were flowing from the source region into the channel region and therefrom into the gate region, begin to flow into the lower potential drain region. As the gate current decreases, the height of the potential barrier in the main (primary) current path in the vicinity of the intrinsic gate is lowered. As the potential height becomes lower, a greater number of electrons will flow toward the drain region, and still further lower the gate current. Such feedback loop effectively causes a very sharp increase in the drain current.

Because of the presence of such sharp increase in a drain current, the semiconductor device according to the present invention has a very low output impedance, and exhibits a very small voltage drop during conduction. Further the device provides a very highly efficient operation with little power dissipation. This semiconductor device is extremely useful for use in integrated circuitry and for use as a high efficiency switching device for high power application.

Description has been made above of a normally-off type semiconductor device. However, the technical concept of the present invention is not limited to a normally-off type device. It should be understood that, a device exhibiting a normally-on type operation can be made to manifest similar phenomena. A normally-on device typically has a high impurity concentration in the channel region and/or a wider gate-to-gate distance. A characteristic similar to that described above with respect to a normally-off type device can be obtained where the injection of minority carriers from the gate region has become prominent, by deeply forward biasing the gate region. In this latter instance, however, the current build-up of the normally-on device is not as steep as the very steep rise of current shown in FIG. 2, and the saturation of current is not as perfect as that noted in FIG. 2B. This because the effect of the gate voltage on the channel region in the vicinity of the source region is smaller in the case of the normally-on device. In any case, similar characteristics can be obtained if the device structure provides an intrinsic gate point in the vicinity of the source region (which is formed with a high impurity concentration region), and a large resistance is present in the vicinity of the intrinsic gate point (distributed between the main current path and the gate regions) through which the gate current must flow. The portion of the channel region in the cross-sectional plane perpendicular to the main current path and passing through the intrinsic gate, in effect operates as a virtual base region, similar to that of a bipolar transistor. A large base resistance, present in the virtual base region, constitutes a feature of a semiconductor device in accordance with the present invention.

Other embodiments of the semiconductor device of the present invention will be described hereunder.

Figure 6:
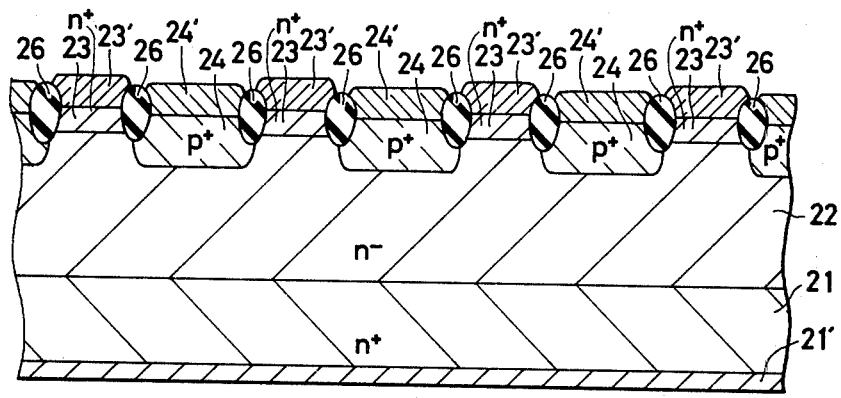
FIGS. 6, 7, 8, 9, 10, 11 and 12 are diagrammatic sectional views of other embodiments of the present invention, respectively.

FIG. 6 shows a diagrammatic sectional view of a device having a structure basically similar to that shown in FIG. 1. In the structure of FIG. 6, however, an insulating region 26 is introduced in order to decrease the capacitance and the current between the p+ gate region 24 and the n+ source region 23. The n+ region 21 serves as the drain region, and the n− region 22 represents a region of constituting a channel region. Numerals 21', 23' and 24' designate a drain electrode, a source electrode and a gate electrode, respectively.

Figure 7:
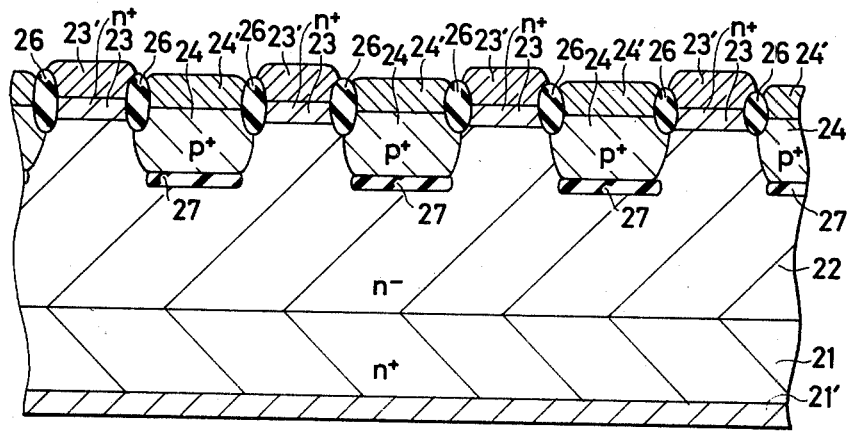

In order to decrease the gate-to-drain capacitance and the gate-to-drain current, an introduction of an insulating film just under the gate region is very effective, as illustrated in FIG. 7. Numeral 27 designates the insulating film.

Figure 8:
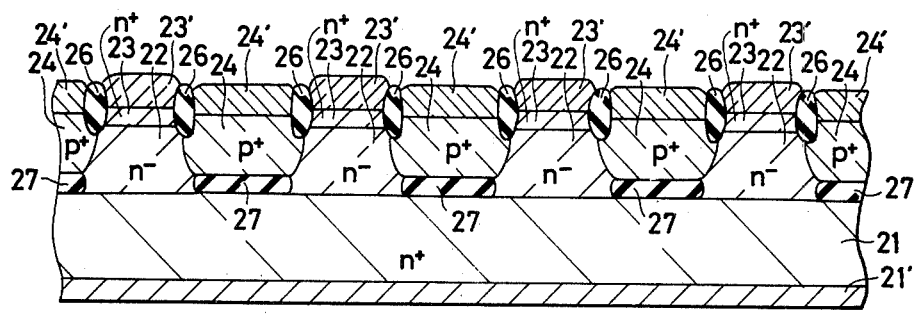

In FIGS. 6 and 7, the gate-to-drain distance is rather long, so that the gate-to-drain breakdown voltage is rather high. Therefore, these structures are suitable for high-power devices. On the other hand, the gate-to-drain breakdown voltage need not be so high in integrated circuit applications. In an integrated circuit application, the source-to-drain voltage in the on-state should be as small as possible, so that the source-to-drain distance must be shortened, as illustrated in FIG. 8. In FIG. 8, an insulating film 27 is disposed between the p+ gate region 24 and the n+ drain region 21. In this structure, the insulating film 27 is not always necessary, but its existence provides a decrease in the gate-to-dain current and the gate-to-drain capacitance. In this structure, the n+ region 21 can serve as the source region, whereas the n+ region 23 serves as the drain region. This operation is called an inverse operation as compared with the normal operation wherein the n+ region 23 serves as the source region.

Figure 9:
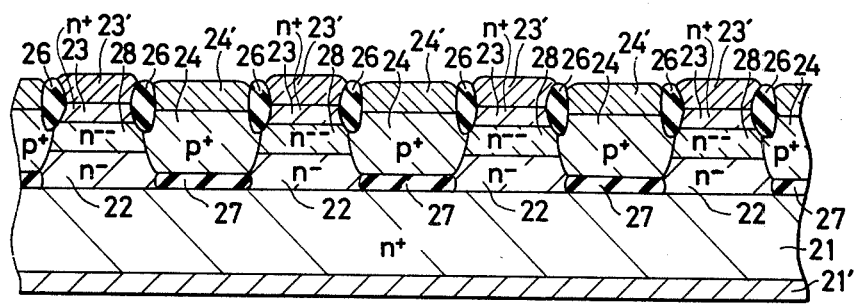

In order to increase the resistance between the gate and the intrinsic gate, further high resistivity region 28 can be introduced as shown in FIG. 9. For some applications, the high resistivity region is disposed adjacent to the n+ type region 21.

Figure 10:
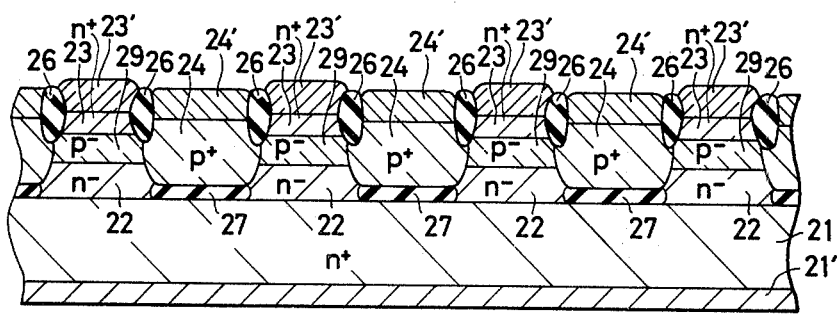

An introduction of the p− high resistivity region 29 is very effective to decrease the source-to-drain distance, in a normally-off device. FIG. 10 shows a sectional view of a device having a p− high resistivity region 29.

Figure 11:
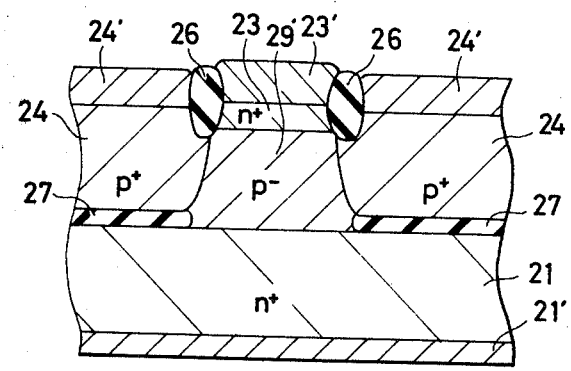

In FIG. 11, the entire region from source to drain is occupied by the p− high resistivity region.

An introduction of the p− type high resistivity region tends to increase the potential barrier height in the channel, so that the channel length can be reduced. The thickness and the impurity concentration of the p− type region are chosen to insure that this region will become almost or completely depleted. The p− type region can be replaced by a p type region in the some structures, wherein the p type region will serve, in effect, as an high resistivity region.

Figure 12:
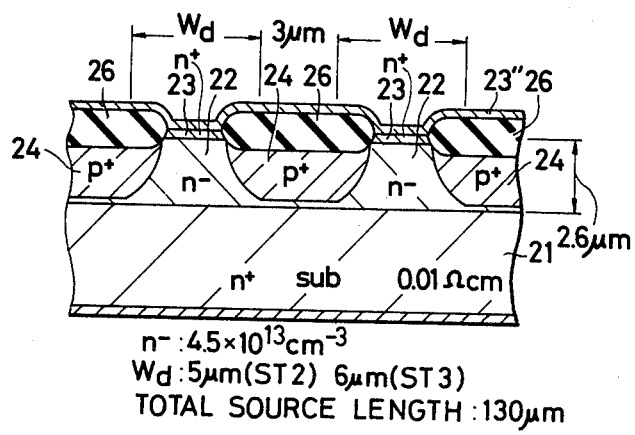

FIG. 12 shows a sectional view of one embodiment of the present invention. The source electrode comprises a highly-doped n+ type polysilicon 23″. The gate electrode is not shown in this Figure.

FIGS. 13, 14 and 15 shows the relationship of the current to the voltage of the example shown in FIG. 12, wherein the thickness and the impurity concentration of the n− epitaxial layer are about 2.6 μm and about $4.5 \times 10^{13}$ cm$^{-3}$, respectively, and the gate diffusion depth is about 2.1 μm. The device of FIG. 12 comprises five channels, with the n+ region 23 having a length of 30 μm. The gate-to-gate spacings at mask level $W_d$, are set at 5 μm (ST2) and 6 μm (ST3). The resistivity of the n+ type substrate is 0.01 Ω-cm.

Figure 13B:
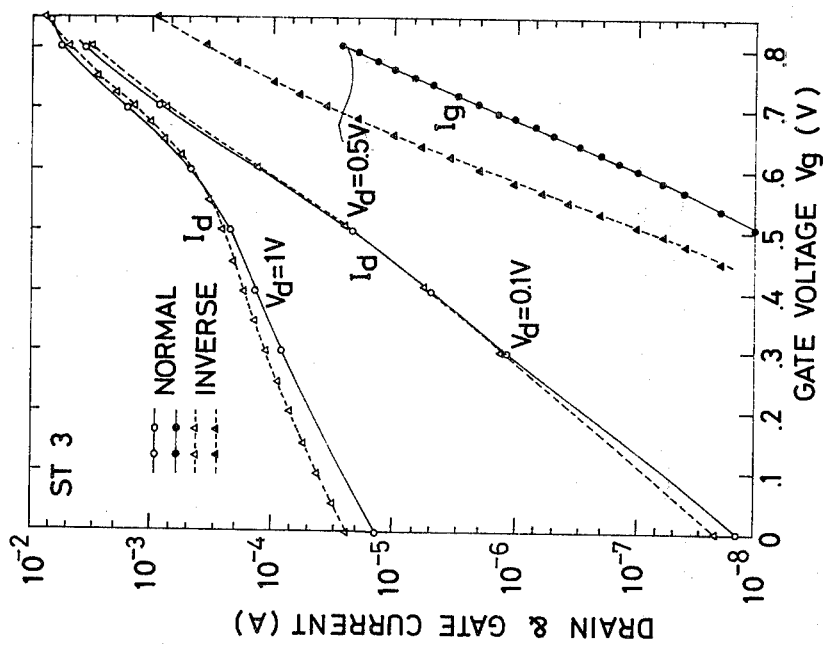
FIG. 13 shows the relationship of drain current to forward gate bias voltage of the example shown in FIG. 12, wherein the gate-to-gate spacing at mask level is set at 5 $\mu$m in FIG. 13A and 6 $\mu$m in FIG. 13B.
Figure 13A:
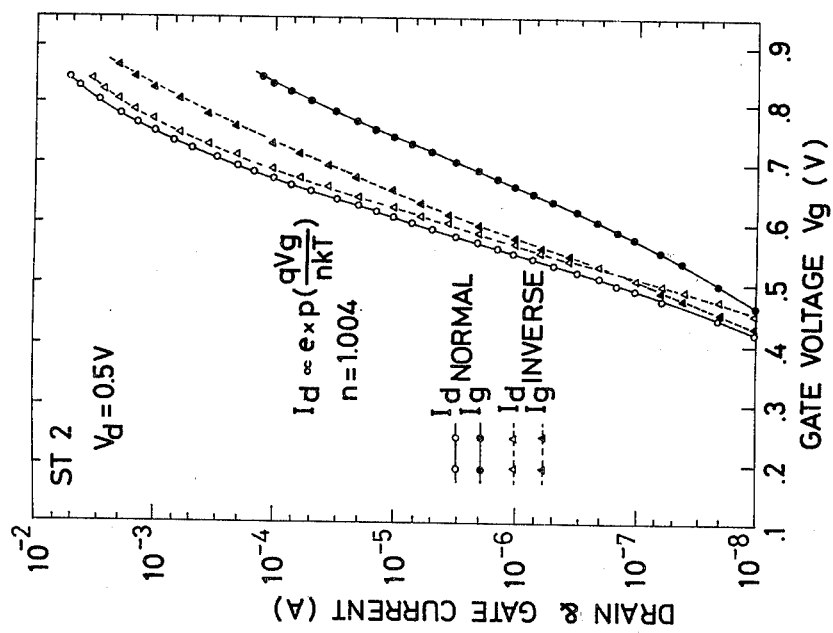

The drain current and the gate current are plotted as a function of the forward gate bias voltage $V_g$ in FIG. 13. FIG. 13A illustrates the operation of device ST2, and FIG. 13B illustrates the operation of device ST3. In these Figures, the solid lines relate to normal operation, and the dashed lines relate to inverse operation. FIG. 13 suggests that device ST2 provides complete normally-off operation while device ST3 provides only an incomplete normally-off operation. The gate current in the inverse operation mode is shown in these Figures to be larger than that in the normal operation mode by at least one order of magnitude.

Figure 14B:
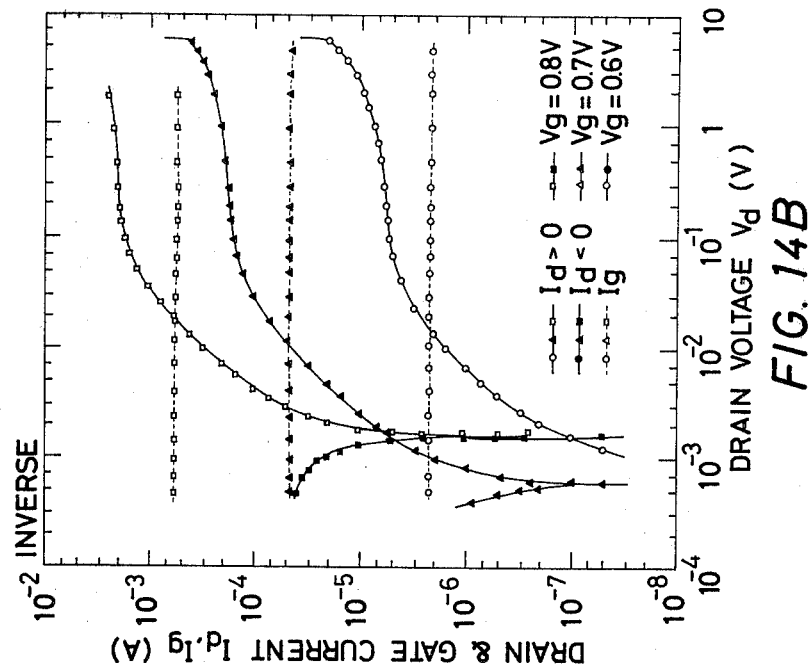
FIG. 14 shows the drain current-drain voltage characteristic of the example in FIG. 12 having the gate mask spacing of 5 $\mu$m, wherein the result in the normal operation mode is shown in FIG. 14A and the result in the reverse operation mode is shown in FIG. 14B.
Figure 14A:
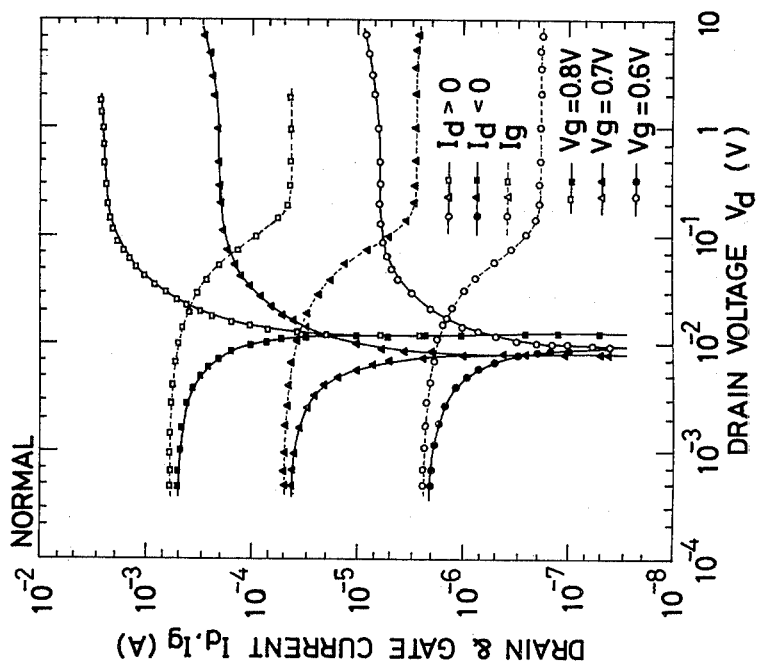

FIG. 14 illustrates the relationship of the drain current and the gate current to the drain voltage in exemplary device ST2 for three different gate voltages such as 0.6 V, 0.7 V and 0.8 V. FIG. 14A relates to normal operation and FIG. 14B relates to inverse operation.

The solid symbols ●, ▲ and ■ designate negative current. These Figures suggest that the polarity of the drain current changes from negative to positive at the threshold voltage. It should be noted that, in the normal operation mode, the gate current progressively decreases with increased drain voltage, but eventually becomes constant, and substantially independent of drain voltages higher than 0.1 V.

Figure 15B:
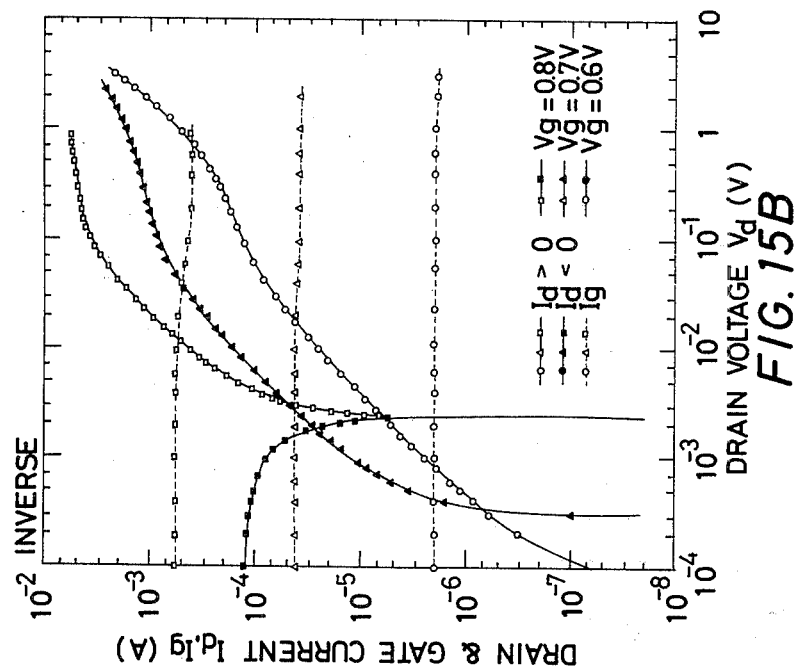
FIG. 15 shows the drain current-drain voltage characteristic of the example in FIG. 12 having the gate mask spacing of 6 $\mu$m, wherein the normal operation is shown in FIG. 15A and the inverse operation is shown in FIG. 15B.
Figure 15A:
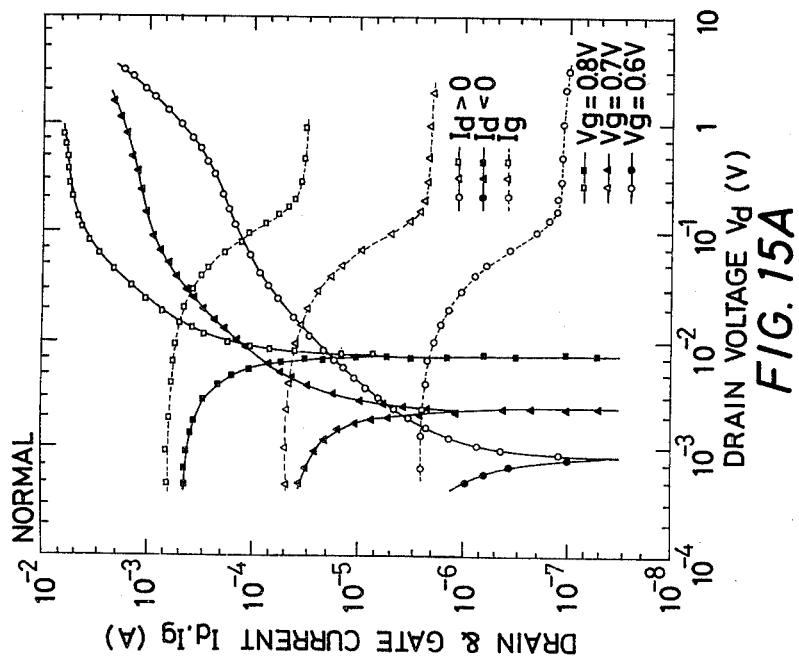

FIG. 15 indicates the relationship of the drain current and the gate current to the drain voltage in exemplary device ST3 for three different gate voltages, 0.6 V, 0.7 V and 0.8 V. FIG. 15A relates to normal operation and FIG. 15B relates to inverse operation.

FIGS. 13, 14 and 15 indicate that the gate current is rather high, particularly in the inverse operation.

Figure 16:
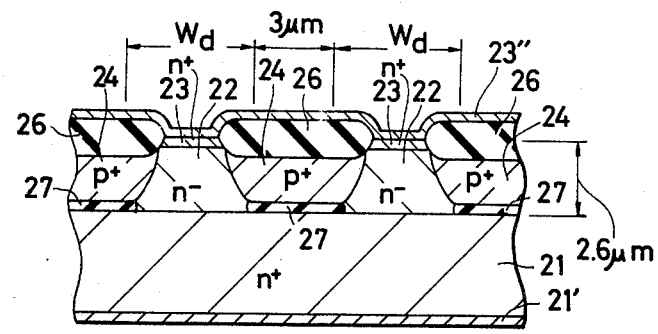
FIG. 16 is a diagrammatic sectional view of another embodiment of the present invention.

Introduction of an insulator film 27 just under the gate region as shown in FIG. 16 is very effective to decrease the gate current. The remaining structure is similar to that shown in FIG. 12.

Figure 17B:
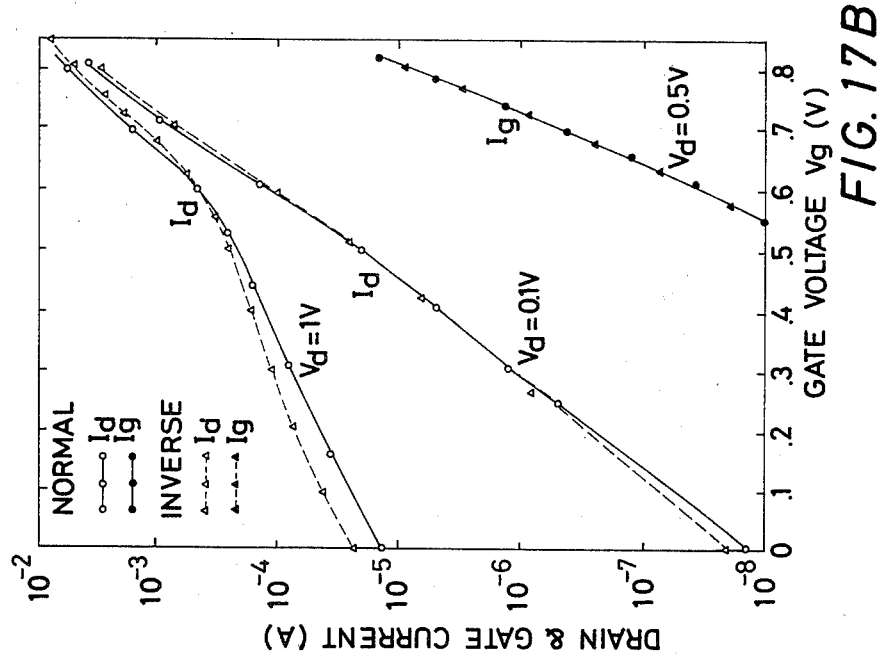
FIG. 17 indicates the relationship of drain current to forward gate bias voltage of the example shown in FIG. 16, wherein the gate mask spacing is set at 5 $\mu$m in FIG. 17A and 6 $\mu$m in FIG. 17B.
Figure 17A:
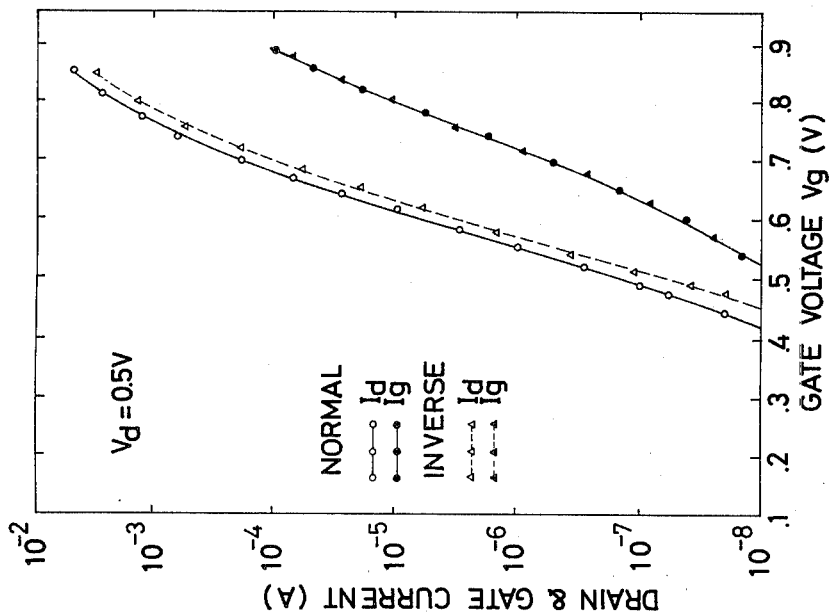
Figure 18B:
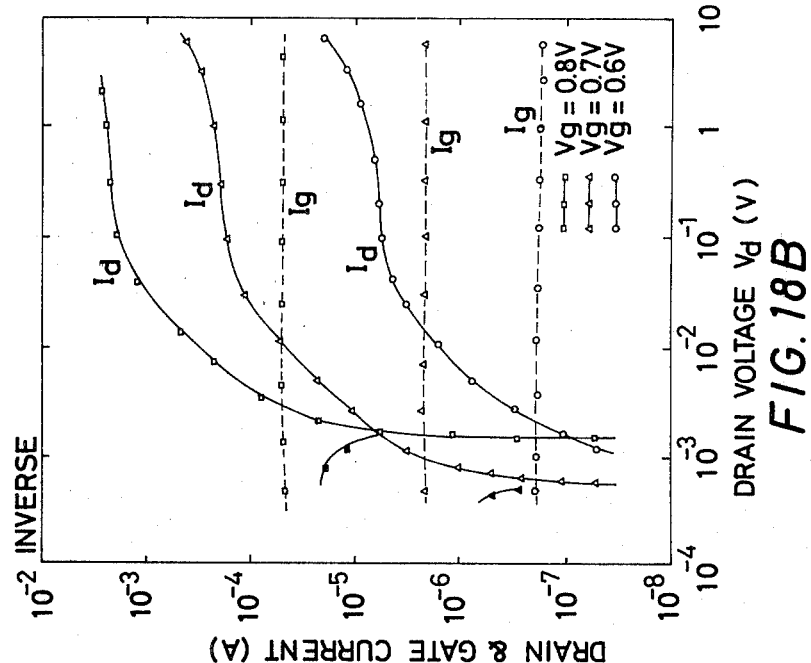
FIG. 18 indicates the drain current-drain voltage characteristic of the example in FIG. 16 having the gate mask spacing of 5 $\mu$m, wherein the normal operation is shown in FIG. 18A and the inverse operation is shown in FIG. 18B.
Figure 18A:
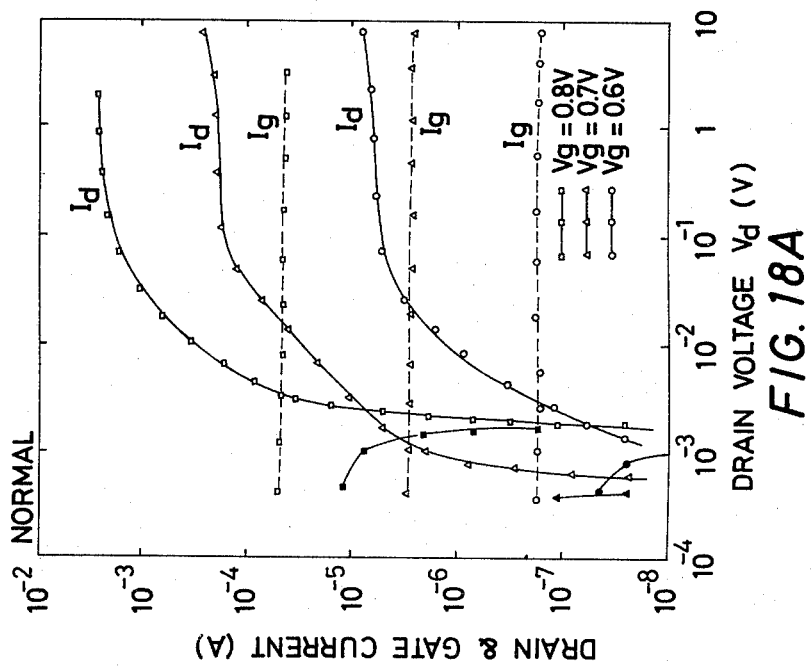

FIGS. 17, 18 and 19 indicate the relation of the drain current and the gate current to the drain voltage and gate voltage in the device of FIG. 16. FIGS. 17, 18 and 19 indicate that the drain current of the device shown in FIG. 16 is similar to that of the device shown in FIG. 12, while the gate current becomes very small, particularly in the inverse operation mode.

Figure 20:
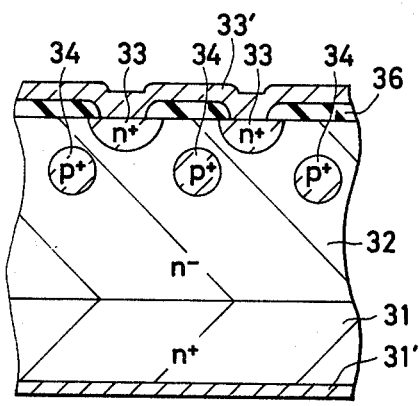
FIGS. 20, 21 and 22 are diagrammatic sectional views of other embodiments of the present invention, respectively.

FIG. 20 shows a diagrammatic sectional view of a device, having a gate region in the form of an embedded region mesh stripes. The n+ type regions 31 and 33 will operate as a drain region and a source region, respectively. The n− region 32 provides a region for constituting a channel region. The p+ type region 34 designates a gate region. Numerals 33′ and 31′ designate a source electrode and a drain electrode, respectively. Numeral 36 designates an insulating layer.

Figure 21:
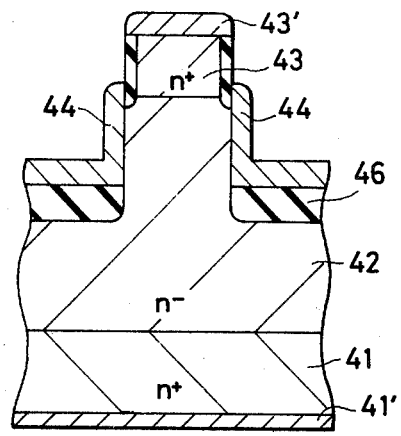

FIG. 21 shows a diagrammatic sectional view of an embodiment of a semiconductor device in accordance with the present invention having a gate formed with a Schottky electrode 44.

Figure 22:
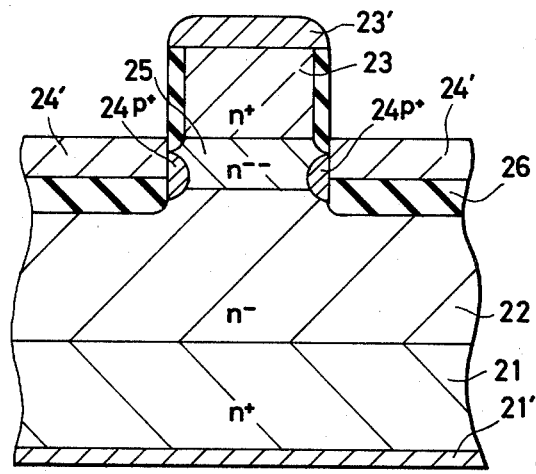

In order to make the effect of the virtual base more prominent, it is only necessary to provide a very high resistivity region in a pattern crossing the channel region, contiguous with the gate. An example of such a structure is shown in FIG. 22. A high resistivity region 25 is provided adjacent to the source region. Because the base resistance $r_{vb}$ of the virtual base is much greater, and because the adjacent source region is of high impurity concentration (and thus provides a large quantity of electrons for injection), the device will exhibit a very steep build-up current. A device similar to that shown in FIG. 22, but with a p type high resistivity region (p− region) substitute for n− region 25 will exhibit substantially the same characteristic. Such arrangement will provide a structure resembling that of a bipolar transistor. However, the difference is noted that the dimensions and the impurity concentration of the base region are selected so that the base region will become almost completely depleted. In other words, the base region is, in effect, a non-uniform potential region.

Figure 23:
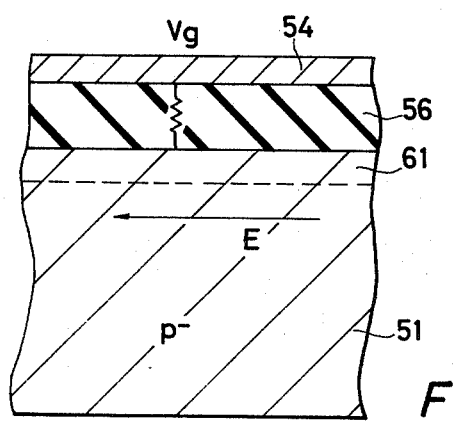
FIG. 23 is a diagrammatic sectional view of an insulated-gate type device for explaining the principles of the present invention.

Similar technical concept can be applied also to an insulated-gate type device. FIG. 23 illustrates an insulated-gate type semiconductor device embodying the present invention. Numeral 54 designates a gate electrode. Numeral 56 designates an insulating layer made of for example $SiO_2$, $Si_3N_4$, $Al_2O_3$ and AlN, a mixture of the foregoing or, a multi-element insulating layer mixed with other substance such as PbO in order to enhance conductivity. When a positive voltage is applied to the gate, an inversion layer is produced in the surface of the semiconductor body. Since a voltage is applied between the gate region and the channel region, a current flows between the gate region and the channel region, through the resistance of the insulating film of the gate. The concentration of the carriers (in this instance, electrons), in the inversion layer produced by the resulting voltage drop, is therefore lowered. However, the effect of the drain voltage on the channel portion located near the source region, causes carriers produced by the application of a gate voltage to flow into the drain region rather than flowing into the gate region. Accordingly the amount of current flowing into the gate region decreases. When the amount of current flowing into the gate region decreases, the gate voltage will, in effect, be applied directly to the channel region, so that the drain current will increase all the more. This means that the feedback phenomenon explained in connection with the junction type device also takes place in an insulated-gate type device (which is called MOS type device). Accordingly, the build-up of the source-to-drain current of this MOS type device is also extremely sharp. That is, the current-voltage characteristic of an MOS type device which exhibits a non-saturating characteristic will rise very sharply. In this structure, for some applications, the conductivity of a portion of the insulating film located near the source region may be slightly increased with respect to the remainder of the film, in order to increase the input impedance.

Figure 24A:
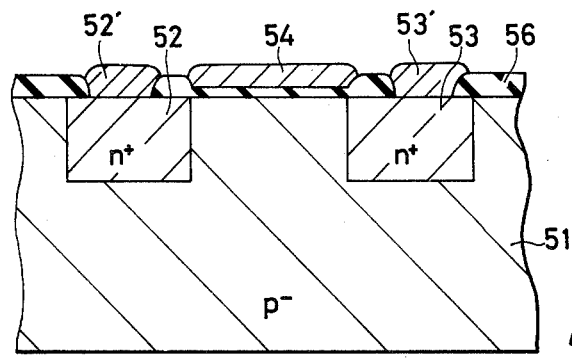
FIGS. 24A, 24B and 24C are diagrammatic sectional views of other embodiments of the insulated-gate type semiconductor device of the present invention.

An embodiment of a MOS type structure according to the present invention is shown in FIG. 24. FIG. 24A depicts an example wherein a gate electrode 54 extends from above the source region 52 to above the drain region 53. The impurity concentration of the p$^-$ region 51 and the distance between the source region and the drain region are selected so that the potential in the vicinity of the source region is efficiently controlled by the drain voltage. It is desirable that this structure be constructed to enter a "punching-through" state, wherein a potential barrier remains in the foreground of the source region. However, the device may provide a "punch-through" state wherein there is no potential barrier present at all. In order to place the device into the "punch-through" state, it is effective to arrange so that the impurity concentration is further lowered and that the source-to-drain distance is smaller as compared with those of the "punching-through" state.

Figure 24B:
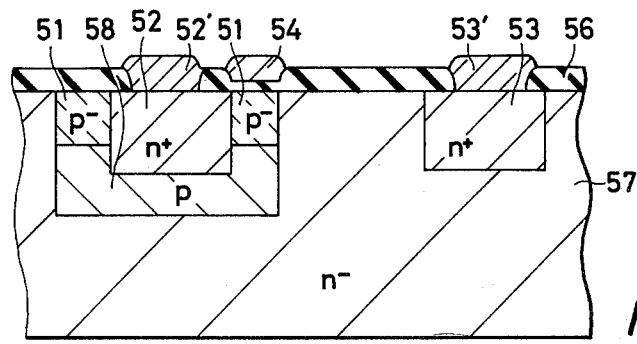

FIG. 24B depicts an embodiment of the present invention particularly suited for providing an extremely sharp build-up of the drain current. A p$^-$ channel region 51 is provided only in the vicinity of the source region 52 and an n$^-$ high resistivity region 57 is provided between the channel region 51 and the drain region 53. A P region 58 is disposed in the vicinity of the bottom surface of source region 52. P region 58 suitably underlies the bottom portion of source 52 and wraps around source 52 to become adjacent to channel 51. The impurity concentration and the dimensions of the n$^-$ type region 57 are selected so that, in the main operative state, the drain voltage will controllably effect that portion of the channel region located in the vicinity of the source region. Those electrons which have passed through the channel flow divergently within the n$^-$ region 57, and have no space charge resistance. Accordingly, n$^-$ region 57 has very little deleterious effect on the build-up of current.

Figure 24C:
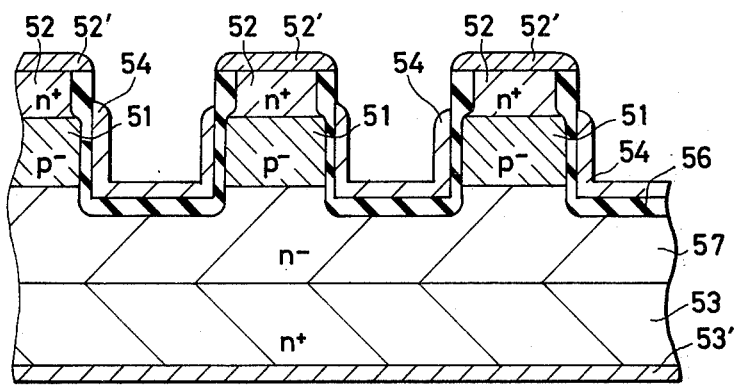

Furthermore, the channel 51 is defined between the main surface and the p type region 58. As a result, efficient control of current by gate voltage is provided. This means that the device has a large transconductance. Where the drain voltage is low and there is no flow of drain current (i.e., in the small drain voltage region), the electric charge in the channel flows to the gate region. Accordingly, in the small drain voltage region the gate voltage has little effect on the channel. When the drain voltage reaches the predetermined voltage at which a current flows toward the drain region, the amount of current flowing to the gate region decreases, and therefore the potential of the channel decreases in accordance with the gate voltage. Thus, the current will flow all the more toward the drain region. In other words, the negative feedback action resulting from the resistance distributed between the gate region and the channel region disappears. In FIG. 24C is shown an example of a U-shape type MOS device.

It will be evident to those skilled in the art that the semiconductor devices according to the present invention are not limited to those embodiments described above. In the embodiments described, one of the main electrode regions is the substrate, but it can be replaced by a buried region. Similarly, the device may have a structure in which the conductivity types of the respective regions are all reversed, or the structures of the respective embodiments described above may be modified in various ways, or they may be combined together.

In short, the device may have any structure so long as the structure is arranged such that:

(1) a high-resistance is provided between the gate region (which controls the potential of the main current path channel region) and the main current path;

(2) a current is allowed to flow between the main current path and the gate region; and (3) when a current flows toward the drain region, the amount of current flowing into the gate region decreases, to effect more efficient control of the channel region potential by the gate voltage and thus accelerate the increase in the amount of the drain current.

The gate structure may be either junction, Schottky, or insulated-gate type. Also, the operation mode of the device may be of either the depletion mode or the enhancement mode type. The gate is generally called a control electrode.

It should be noted that insulating materials are not perfect insulators, and that such materials do allow a trivial (leakage) current to flow. Therefore, these substances may well be considered high resistivity semiconductors.

The semiconductor devices of the present invention can be manufactured by relying on the known crystal growth, diffusion, ion-implantation, fine patterning, lithography, CVD, thermal oxidation, wiring and like techniques.

The semiconductor device of the present invention is constructed so that, due to the feedback action of the resistance between the gate and the main current path, the current-voltage characteristic rises extremely sharply. The device has a small resistance when in the current conducting state, a large transconductance, and operates with a very small voltage. The device is able to provide an integrated circuit which operates at a high speed with ultra-low energy. In addition, the device can be used as a very efficient and high-speed discrete switching device. Thus the industrial value of the present invention is very high.

What is claimed is:

1. In a semiconductor device containing at least one static induction transistor, said transistor including a source semiconductor region and a drain semiconductor region both having a first conductivity type and a low resistivity, a channel region having said first conductivity type and a high resistivity and a gate region having a second conductivity type opposite to said first conductivity type and having a low resistivity;

said source and drain region being disposed to define a main current path therebetween through said channel region, said gate region being disposed to substantially control the potential of an intermediate semiconductor region in said current path, the improvement wherein:

said intermediate semiconductor region is interposed in said current path contacting said source region, gate region and channel region, and is of said first conductivity type, and a resistivity higher than that of said channel region;

and said transistor further includes:

a first isolating insulator region disposed in contact with said gate region and disposed between said gate region and said drain region; and a second insulator region disposed to isolate said souce region from said gate region.

2. A semiconductor device containing at least one static induction transistor, said transistor including a source semiconductor region and a drain semiconductor region both having a first conductivity type and a low resistivity, a channel region having said first conductivity type and a high resistivity and a gate region having a second conductivity type opposite to said first conductivity type and having a low resistivity;

said source and drain region being disposed to define a main current path therebetween through said channel region, said gate region being disposed to substantially control the potential of an intermediate semiconductor region in said current path, the improvement wherein:

said an intermediate semiconductor region is interposed in said current path contacting said source region, gate region and channel region, and is of said second conductivity type and a high resistivity;

and said transistor further includes:

a first isolating insulator region disposed in contact with said gate region and disposed between said gate region and said drain region; and a second insulator region disposed to isolate said source region from said gate region.

3. The device of claim 1 or 2 wherein said first insulator region is disposed in contact with said drain region.

4. A semiconductor device containing at least one static induction transistor, said transistor comprising:

a source region having a first conductivity type and a low resistivity;

an intermediate semiconductor region provided in contact with said source region and having a second conductivity type opposite to said first conductivity and having a high resistivity;

a drain region having said first conductivity type and a low resistivity;

a semiconductor region intervening between said intermediate region and said drain region in contact with both of them and having said first conductivity type and a high resistivity;

an insulator film formed on one surface of said intermediate region; and a gate electrode provided on said insulator film.

5. A semiconductor device containing at least one static induction transistor, said transistor comprising:

a source region having a first conductivity type and a low resistivity;

an intermediate semiconductor region provided in contact with said source region and having a second conductivity type opposite to said first conductivity and a high resistivity;

a drain region having said first conductivity type and a low resistivity;

an intervening semiconductor region intervening between said intermediate region and said drain region in contact with both thereof, said intervening region having said first conductivity type and a high resistivity;

a semi-insulating film formed on one surface of said intermediate region;

a control electrode provided on said semi-insulating film.

6. A semiconductor device containing at least one static induction transistor, said transistor comprising:

a main surface;

a source region having a first conductivity type of a low resistivity, and being disposed to contact said main surface;

a first intermediate semiconductor region having a second conductivity type opposite to said first conductivity type and having a high resistivity, and being disposed to contact with a portion of said source region;

a second intermediate semiconductor region of said second conductivity type but having a resistivity lower than that of said first intermediate semiconductor region, said second intermediate semiconductor region being disposed to surround portions of said source region not in contact with said first intermediate region;

a drain region of said first conductivity type, having a low resistivity;

a semiconductor region intervening between at least said first intermediate semiconductor region and said drain region, contacting said first intermediate semiconductor, said drain region and having said first conductivity type and said high resistivity;

a film, disposed to at least contact said first intermediate semiconductor region, comprising an insulating material; and a gate electrode contacting at least said film.

7. The device of claim 4 or 6 wherein said film is formed of a material selected from the group consisting of $SiO_2$, $Si_3N_4$, $Al_2O_3$, AlN and a mixture of them.

8. The device of claim 4 or 6 wherein said film comprises a multi-element insulating layer mixed with a conductivity enhancing element.

9. The device of claim 8 wherein said conductivity enhancing element is PbO.

10. The device of claim 6 wherein said film is formed of insulating material having a conductivity enhancing element mixed therewith.

* * * * *